(12) United States Patent
Noguchi

(10) Patent No.: US 7,699,482 B2
(45) Date of Patent: Apr. 20, 2010

(54) LIGHT-EMITTING ELEMENT

(75) Inventor: Takafumi Noguchi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/667,368

(22) Filed: Sep. 23, 2003

(65) Prior Publication Data

US 2004/0056592 A1   Mar. 25, 2004

(30) Foreign Application Priority Data

Sep. 25, 2002   (JP) .................. 2002-279015
Sep. 27, 2002   (JP) .................. 2002-283689

(51) Int. Cl.
*F21V 9/16* (2006.01)
(52) U.S. Cl. .................. 362/84; 362/617; 362/619; 362/293; 362/244; 362/326
(58) Field of Classification Search .......... 349/69, 349/106, 86, 42, 122; 313/504, 506; 362/84, 362/561, 459, 545, 6, 8, 446, 470, 505, 506, 362/259, 231, 2, 602, 606, 617–620, 34, 362/166, 230, 244, 293, 326, 330
See application file for complete search history.

(56) References Cited

U.S. PATENT DOCUMENTS

| | | | |
|---|---|---|---|
| 5,855,994 A |   | 1/1999 | Biebuyck et al. |
| 6,025,894 A | * | 2/2000 | Shirasaki et al. .............. 349/69 |
| 6,117,529 A | * | 9/2000 | Leising et al. .............. 428/209 |
| 6,327,554 B1 | * | 12/2001 | Kobori .................. 703/5 |
| 6,528,188 B1 |   | 3/2003 | Suzuki et al. |
| 6,556,260 B1 | * | 4/2003 | Itou et al. .................. 349/69 |

(Continued)

FOREIGN PATENT DOCUMENTS

JP      63-314795 A      12/1988

(Continued)

OTHER PUBLICATIONS

Japanese Office Action dated Jun. 19, 2007 issued in corresponding Japanese Application No. 2002-279015.

(Continued)

*Primary Examiner*—Jacob Y Choi
(74) *Attorney, Agent, or Firm*—Sughrue Mion, PLLC

(57) ABSTRACT

The light-emitting element emits light itself. The element includes a light-emitting portion having a higher refractive index than a refractive index of air and a diffraction grating structure provided to a light-emitting side surface of the light-emitting portion. The function that a minimum light-emission value is equal to or less than 50% of a maximum light-emission value when white light is emitted from the light-emitting portion is realized. The function is obtained by further including a color-separation filter provided between the light-emitting portion and the light-emitting side surface and making a minimum value of a spectral product obtained from a light-emission waveform of the white light emitted from the light-emitting portion and a spectral transmittance of said color-separation filter equal to or less than 50% of a maximum value thereof, or by adjusting a light-emission ratio of the light-emitting materials for said at least two primary colors among the light-emitting materials for the three primary colors.

4 Claims, 8 Drawing Sheets

U.S. PATENT DOCUMENTS

| | | | |
|---|---|---|---|
| 6,873,099 B2 * | 3/2005 | Maeda | 313/504 |
| 6,903,506 B2 * | 6/2005 | Kita et al. | 313/506 |
| 7,048,428 B2 * | 5/2006 | Tahara et al. | 362/626 |
| 2002/0054261 A1 * | 5/2002 | Sekiguchi | 349/122 |
| 2002/0113546 A1 * | 8/2002 | Seo et al. | 313/504 |
| 2002/0121860 A1 * | 9/2002 | Seo et al. | 313/506 |
| 2002/0180348 A1 | 12/2002 | Oda et al. | |
| 2003/0048072 A1 * | 3/2003 | Ishihara et al. | 313/506 |
| 2004/0263045 A1 * | 12/2004 | Smith et al. | 313/373 |

FOREIGN PATENT DOCUMENTS

| | | |
|---|---|---|
| JP | 07-142169 | 6/1995 |
| JP | 11-283751 A | 10/1999 |
| JP | 11-329734 | 11/1999 |
| JP | 11-514791 A | 12/1999 |
| JP | 2001-052870 | 2/2001 |
| JP | 2001-155860 A | 6/2001 |
| JP | 2001-260416 | 9/2001 |
| JP | 2002-158095 | 5/2002 |

OTHER PUBLICATIONS

Japanese Office Action dated Jun. 19, 2007 issued in corresponding Japanese Application No. 2002-283689.

* cited by examiner

LIGHT-EMITTING ELEMENT

BACKGROUND OF THE INVENTION

1. Field of the Invention

The present invention relates to a self light-emitting electroluminescent (EL) element which can be suitably used as a surface light source for a display device, a full-color display, a back light, or the like, and more particularly to a self light-emitting element having a higher refractive index at its light-emitting portion than a refractive index of air.

2. Description of the Related Art

In a self light-emitting element, such as an organic EL element or an inorganic EL element, having a higher refractive index at its light-emitting portion than the refractive index of air, there is a limit to the amount of light that can be taken out therefrom due to total reflection.

Known as a technique for enhancing light output efficiency is, for example, a method of enhancing the efficiency by imparting light-condensing properties to a surface of a cathode (see, for example, JP 63-314795 A). In the method, an interface between the cathode and a light-emitting layer needs to be processed. However, because a current is caused to flow in the light-emitting layer, the above-mentioned self light-emitting element with improved light output efficiency is hard to achieve using the method.

There is also known a method of enhancing the light output efficiency by forming a diffraction grating or zone plate as a constituent element between a glass substrate and a luminescent material (see, for example, JP 11-283751 A). The method has the following principle. That is, by forming a transmission-type or reflection-type diffraction grating or zone plate as a constituent element between a light emitting layer and a substrate, an angle of emergence is reduced at an interface thereof, and light reaches again an external interface of a self light-emitting element. As a result, an incident angle with respect to a light output surface can be changed (reduced). Therefore, the light can be taken out to the outside without causing total reflection at the light output surface.

In addition, in the above method, an interface between an anode and the light-emitting layer needs to be processed. However, because a current is caused to flow in the light-emitting layer, the above-mentioned self light-emitting element with improved light output efficiency is hard to achieve using the method.

SUMMARY OF THE INVENTION

The present invention has an object to resolve the above-mentioned problems of the conventional art, and provide a light-emitting element such as an organic EL element, which includes a diffraction grating capable of enhancing light output efficiency without causing an observer to sense unnaturalness.

By the way, according to an invention disclosed in commonly assigned Japanese Patent Application No. 2002-188157, success is achieved in enhancing the light output efficiency by providing a diffraction grating film to a glass substrate surface.

In the innovative method, the efficiency can be enhanced by approximately 1.5 times at the maximum. However, in the case where a light-emission spectrum is continuous, depending on the viewing angle, light emission may be rainbow-colored under the action of the above-mentioned diffraction grating film.

More specifically, the present invention has been made in view of the above-mentioned circumstances, and therefore has an object to resolve the problem in that the light emission becomes rainbow-colored in the organic EL element obtained by providing the diffraction grating film to the glass substrate surface described above.

In order to attain the object described above, the present invention provides a light-emitting element which emits light itself, comprising: a light-emitting portion having a higher refractive index than a refractive index of air; and a diffraction grating structure provided to a light-emitting side surface of the light-emitting portion, wherein a minimum light-emission value is equal to or less than 50% of a maximum light-emission value when white light is emitted from said light-emitting portion.

It is preferable that the light-emitting element of the first aspect of the present invention further comprises: a color-separation filter provided between said light-emitting portion and said light-emitting side surface, wherein a minimum value of a spectral product obtained from a light-emission waveform of the white light emitted from said light-emitting portion and a spectral transmittance of said color-separation filter is equal to or less than 50% of a maximum value thereof, whereby the minimum light-emission value is equal to or less than 50% of the maximum light-emission value when the white light is emitted from said light-emitting portion.

In other words, the light-emitting element of the first aspect of the present invention provides a light-emitting element which emits light itself, comprising: a light-emitting portion having a higher refractive index than a refractive index of air; a diffraction grating structure provided to a light-emitting side surface of the light-emitting portion; and a color-separation filter provided between said light-emitting portion and said light-emitting side surface, wherein a minimum value of a spectral product obtained from a light-emission waveform of the white light emitted from said light-emitting portion and a spectral transmittance of said color-separation filter is equal to or less than 50% of a maximum value thereof.

Preferably, a color-separation filter which has minimum transmittance of equal to or less than 50% of maximum transmittance, more preferably, 30% of the maximum transmittance is used for said color-separation filter.

Preferably, said light-emitting portion includes light-emitting materials for at least two primary colors capable of emitting the white light among light-emitting materials for three primary colors.

Preferably, in the light-emitting element of the first aspect of the present invention, a light-emission ratio of the light-emitting materials for said at least two primary colors among the light-emitting materials for the three primary colors is adjusted to make the minimum light-emission value equal to or less than 50% of the maximum light-emission value when the white light is emitted form said light-emitting portion.

Preferably, said light-emitting portion includes the light-emitting materials for said three primary colors.

Preferably, said light-emitting materials exhibit light emission by singlet exciton or triplet exciton.

Preferably, said diffraction grating structure has a pitch of a fine convex-concave structure being in a range of from 1 µm to 4 µm, and a depth of said fine convex-concave structure being in a range of from 0.4 µm to 4 µm.

Preferably, a ratio of said depth to said pitch in said fine convex-concave structure ranges from 0.25 to 0.60.

Further, in a light-emitting element according to the present invention, as a light-emitting material composing the light-emitting element, it is possible to use a material that emits light by a triplet exciton (so-called "triplet material") in addition to a material that emits light by a singlet exciton (so-called "singlet material").

Furthermore, in the light-emitting element according to the present invention, a three-wavelength type light-emitting material is generally used as a light-emitting material composing the light-emitting element that can emit white light. In addition, it is possible to use, for example, a material structured by combining two kinds of light-emitting materials with a filter having special spectral transmittance characteristics adapted to light-emitting characteristics of the above materials as shown in "Monthly DISPLAY" (pp. 47-51, September, 2002). Alternatively, a material structured by combining the above-mentioned two kinds of light-emitting materials can also be suitably used.

According to the present invention, a ratio of a maximum light-emission value (peak) to a minimum light-emission value (valley) is made as large as possible in a light-emission spectrum when the white light is emitted from the light-emitting element so as to attenuate a diffraction effect. Accordingly, rainbow-colored light emission caused by diffraction can be suppressed to such an extent as not to be perceived by human eyes.

DETAILED DESCRIPTION OF THE PREFERRED EMBODIMENTS

Hereinafter, detailed description will be made of a light-emitting element according to the present invention based on preferred embodiments with reference to the accompanying drawings.

First, FIGS. 1 to 8 are used to describe a light-emitting element according to a first aspect of the present invention.

Figure 1:
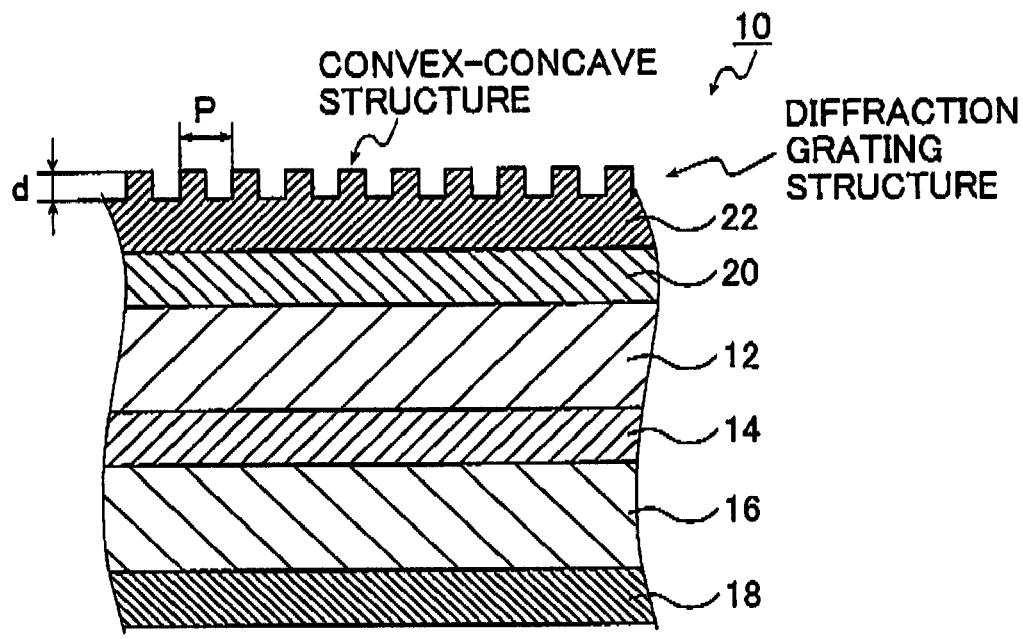
FIG. 1 is a sectional view showing an embodiment of a structure of a light-emitting element according to a first aspect of the present invention.

FIG. 1 is a sectional view showing a structure of a first embodiment of a light-emitting element 10 according to the first aspect of the present invention.

The light-emitting element 10 shown in FIG. 1 is an organic electroluminescent (EL) element. The light-emitting element 10 includes a glass substrate 12. Formed on one side of the glass substrate 12 are an ITO transparent electrode (anode) 14 having a linear shape, a light-emitting layer 16 capable of emitting light by organic electroluminescence, and a rear electrode (cathode) 18 having a linear shape, the respective layers being stacked in the stated order. Also, formed on the other side of the glass substrate 12 are a color-separation filter 20 and a diffraction grating 22, the respective layers being stacked in the stated order.

As the glass substrate 12, the ITO transparent electrode 14, and the rear electrode 18, it is possible to use conventionally known members disclosed in the above-mentioned JP 63-314795 A, JP 11-283751 A etc.

The diffraction grating 22 is formed on a light-emitting outermost surface side of the light-emitting element 10. Here, the diffraction grating 22 is formed on the color-separation filter 20 on one side of the glass substrate 12 opposite the light-emitting layer 16. An exemplary structure of the diffraction grating 22 according to this embodiment preferably has a pitch (P) of a fine convex-concave structure being in a range from 1 μm to 4 μm, and a depth (d) of the fine convex-concave structure being in a range from 0.4 μm to 4 μm. Also, a ratio of (the depth (d) of the fine convex-concave structure)/(the pitch (P) of the fine convex-concave structure) is preferably in a range from 0.25 to 0.60.

The diffraction grating 22 may be obtained by providing the fine convex-concave structure described above directly to a surface of a material that composes the light-emitting outermost surface of the light-emitting element 10, for example, to an outer surface of the color-separation filter 20. Alternatively, the diffraction grating 22 can be easily formed by bonding an optical film separately manufactured as a transmission-type optical film that has the fine convex-concave structure, to the light-emitting outermost surface of the light-emitting element 10 (for example, the outer surface of the color-separation filter 20). Note that as the optical film and a specific method for manufacturing the optical film, it is possible to use an optical film and a manufacturing method therefor that are disclosed in commonly assigned Japanese Patent Application No. 2002-188157 as described above.

Figure 2:
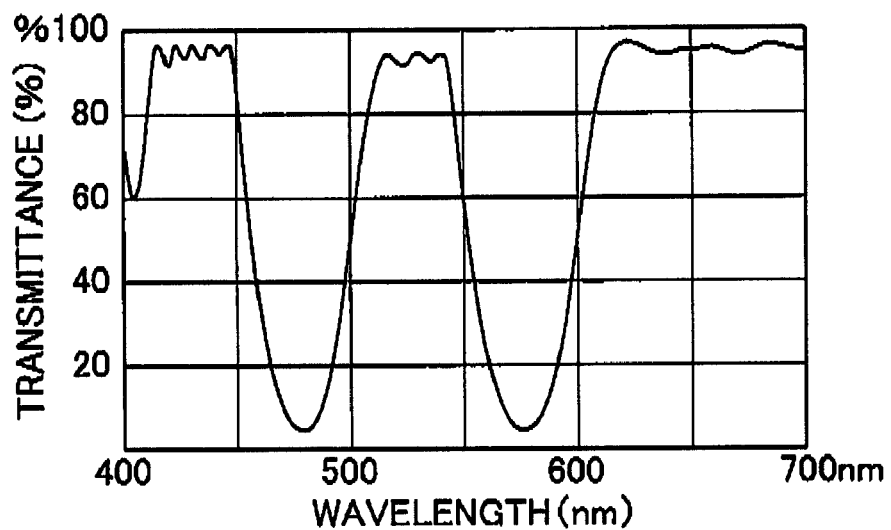
FIG. 2 is a diagram showing optical characteristics (transmittance characteristics) of a color-separation filter used for a light-emitting element in accordance with a first embodiment according to the first aspect of the present invention.

FIG. 2 shows optical characteristics (spectral transmittance characteristics) of the color-separation filter 20. As an example thereof, a three-color-separation filter manufactured by NIKO OPTICS CO., LTD. is used, but the present invention is not limited thereto. The color-separation filter 20 preferably has characteristics of selectively transmitting light at wavelengths in the relative vicinity of the maximum light-emission wavelengths of singlet light-emitting materials for three colors which are used for the light-emitting element 10.

Also, the optical characteristics of the color-separation filter 20 shows that its minimum transmittance is equal to or less than 10% of its maximum transmittance, and includes extremely effective characteristics as a color-separation filter used for the light-emitting element 10 according to this embodiment.

The light-emitting layer 16 is preferably structured by using singlet light-emitting materials or triplet light-emitting materials for three colors.

Here, used as the singlet light-emitting materials for three colors composing the light-emitting layer 16 of the light-emitting element 10 are singlet light-emitting materials described below which are all disclosed in specifications of commonly assigned patent applications. Therefore, those materials have extremely suitable matching with the characteristics of the color-separation filter 20 described above.

1. An example of a blue (B) light-emitting material includes a compound (having a maximum light-emission wavelength of 443 nm) which is represented by the following chemical formula (1):

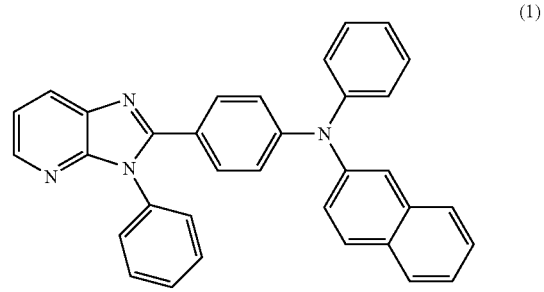

(1)

and disclosed in commonly assigned JP 2001-192653 A.

2. An example of a green (G) light-emitting material includes a compound (having a maximum light-emission wavelength of 547 nm) which is represented by the following chemical formula (2):

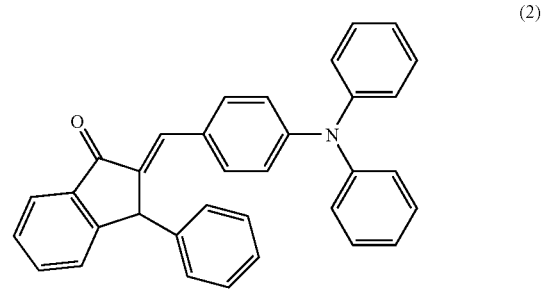

(2)

and disclosed in commonly assigned JP 2001-354955 A.

3. An example of a red (R) light-emitting material includes a compound (having a maximum light-emission wavelength of 615 nm) which is represented by the following chemical formula (3):

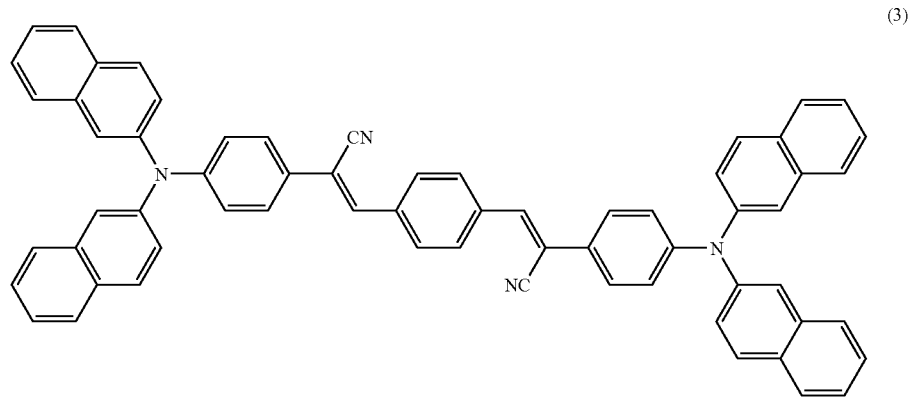

(3)

and disclosed in commonly assigned JP 2001-273977 A.

Figure 3:
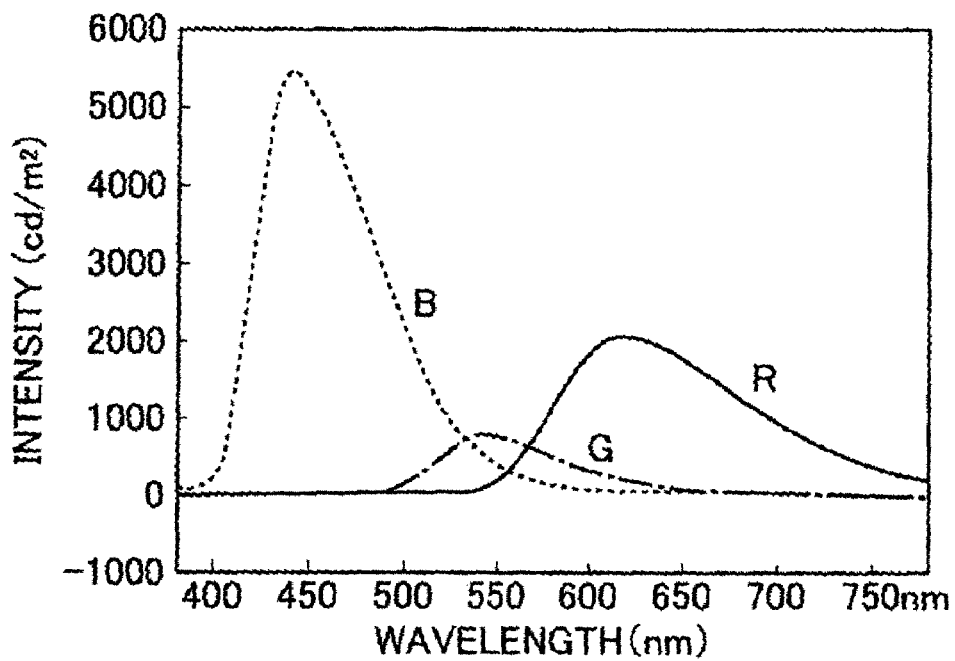
FIG. 3 is a diagram showing light-emitting characteristics of light-emitting materials for three colors which are used for the light-emitting element in accordance with the first embodiment according to the first aspect of the present invention.

FIG. 3 shows light-emission waveforms of the singlet light-emitting materials for the above-mentioned three colors, i.e., blue (B), green (G), and red (R).

According to this embodiment, the light-emitting element 10 is structured as shown in FIG. 1 by combining: the light-emitting layer 16 that is formed by using the light-emitting materials having the above-mentioned light-emitting characteristics; and the color-separation filter 20 that has spectral characteristics shown in FIG. 2 and formed on the light-emitting outermost surface (surface of the glass substrate 12) of the light-emitting portion. The combination enables transmitted light to be suppressed to an extreme extent in a wave range ±25 nm or more apart from the maximum light-emission wavelengths of the respective RGB light-emitting materials.

A minimum value of a spectral product obtained from a light-emission waveform of the white light emitted from a light-emitting portion (the light-emitting layer 16) of the light-emitting element 10 and a spectral transmittance of the color-separation filter 20 is approximately 7% of a maximum value thereof. This percentage shows that the combination of the light-emitting portion (light-emitting layer 16) and the color-separation filter 20 is extremely preferable.

According to the above structure, light that finally outgoes is substantially composed of the three colors (RGB) each having a narrow band, and is perceived as white by human vision. However, the above outgoing light exhibits no continuous spectrum. Accordingly, generation of rainbow-colored light emission, which is caused in the conventional art, can be avoided.

Next, a second embodiment in which materials that emit light by a triplet exciton (so-called "triplet materials") are used will be described.

Used as the light-emitting materials are triplet light-emitting materials described below which are all disclosed in applications assigned to several applicants including The Trustees of Princeton University. Those materials have extremely suitable matching with the characteristics of the color-separation filter 20 described above.

Figure 4:
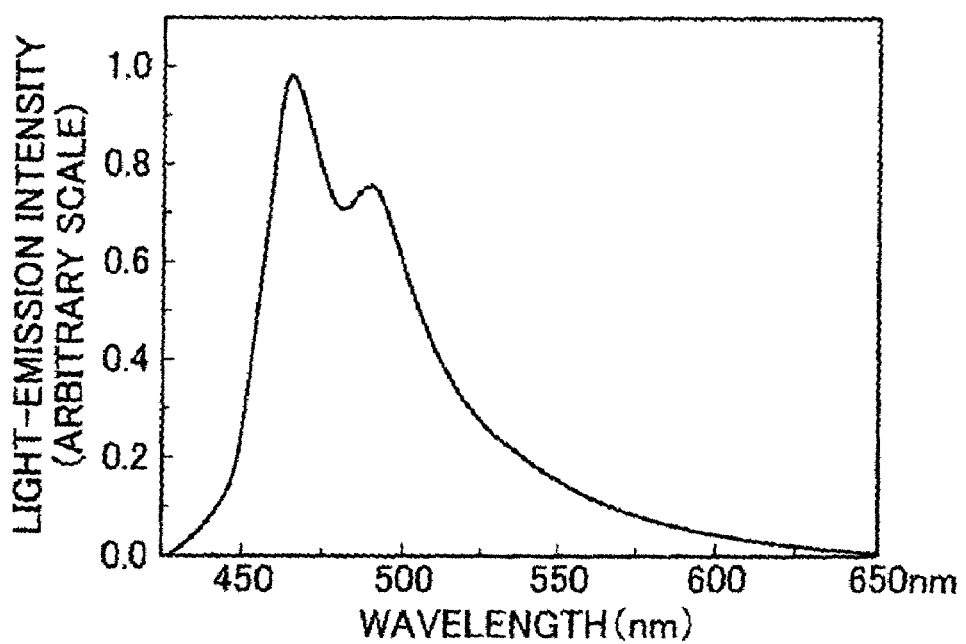
FIG. 4 is a diagram showing light-emitting characteristics of a blue light-emitting material (triplet light-emitting material for blue light emission) used for a light-emitting element in accordance with a second embodiment according to the first aspect of the present invention.

1. An example of the blue (B) light-emitting material includes a compound (whose light-emitting characteristics are shown in FIG. 4) which is represented by the following chemical formula (4):

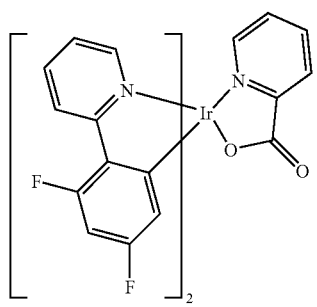

(4)

and disclosed in WO 02/15645 A1.

Figure 5:
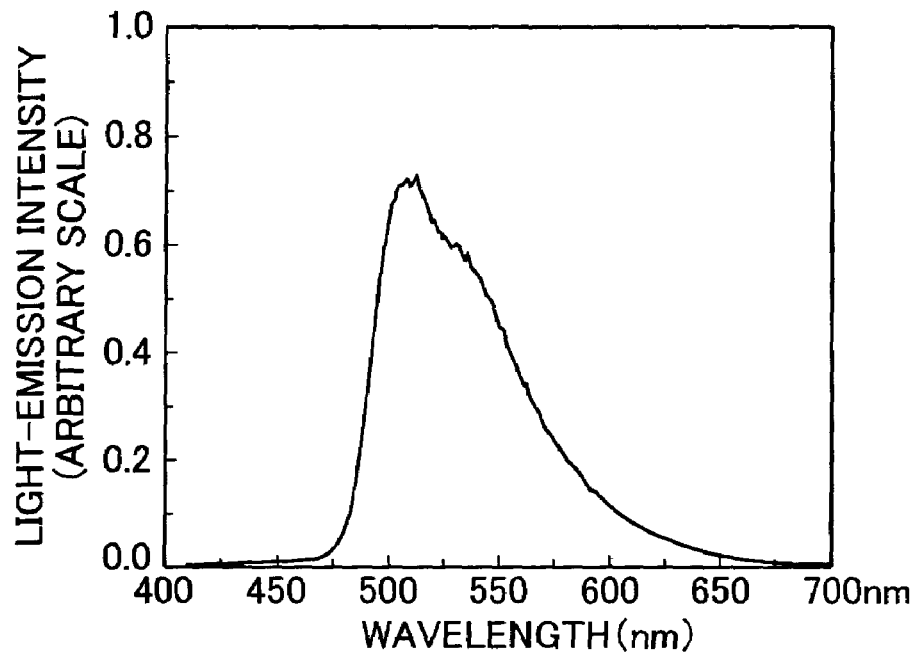
FIG. 5 is a diagram showing light-emitting characteristics of a green light-emitting material (triplet light-emitting material) used for the light-emitting element in accordance with the second embodiment according to the first aspect of the present invention.

2. An example of the green (G) light-emitting material includes a compound (whose light-emitting characteristics are shown in FIG. 5) which is represented by the following chemical formula (5):

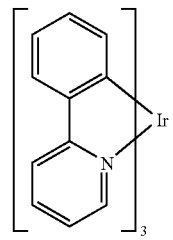

(5)

and disclosed in WO 00/70655.

Figure 6:
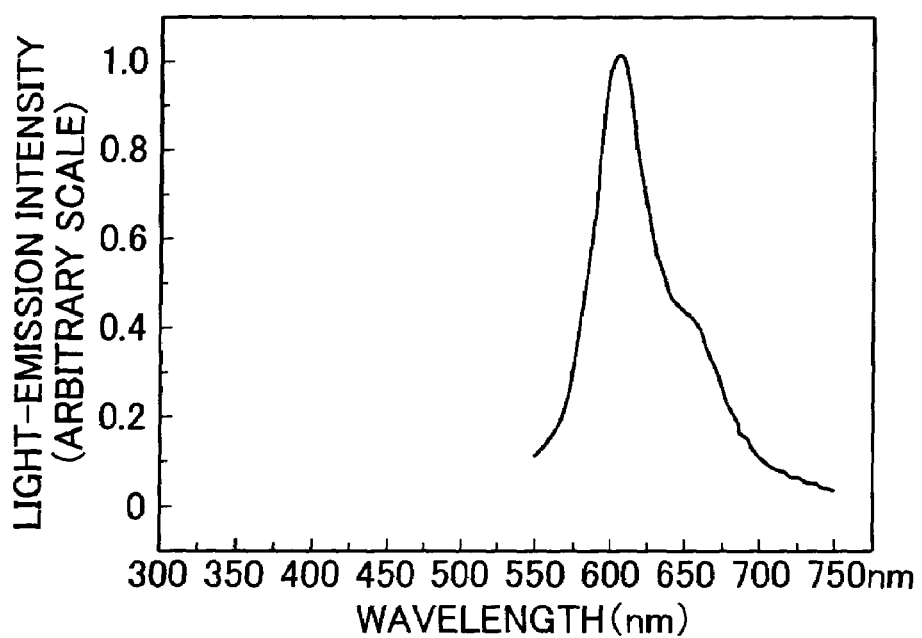
FIG. 6 is a diagram showing light-emitting characteristics of a red light-emitting material (triplet light-emitting material) used for the light-emitting element in accordance with the second embodiment according to the first aspect of the present invention.

3. An example of the red (R) light-emitting material includes a compound (whose light-emitting characteristics are shown in FIG. 6) which is represented by the following chemical formula (6):

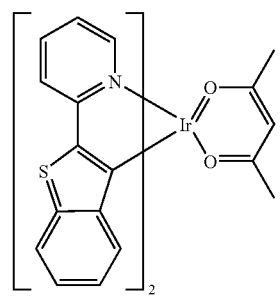

(6)

and disclosed in WO 01/41512 A1.

According to this embodiment as well, the light-emitting element 10 is structured as shown in FIG. 1 by combining: the light-emitting layer 16 that is formed by using the triplet materials having the above-mentioned light-emitting characteristics instead of using the singlet materials; and the color-separation filter 20 that has spectral characteristics shown in FIG. 2 and formed on the light-emitting outermost surface (surface of the glass substrate 12) of the light-emitting portion. The combination enables the transmitted light to be suppressed to an extreme extent in the wave range ±25 nm or more apart from the maximum light-emission wavelengths of the respective RGB light-emitting materials.

The minimum value of the spectral product obtained from the light-emission waveform of the white light emitted from the light-emitting portion (the light-emitting layer 16) of the light-emitting element 10 and a spectral transmittance of the color-separation filter 20 is approximately 7% of a maximum value thereof. This percentage shows that the combination of the light-emitting portion (light-emitting layer 16) and the color-separation filter 20 is extremely preferable.

According to the above structure, the light that finally outgoes is substantially composed of the three colors (RGB) each having a narrow band, and is perceived as white by human vision. However, the above outgoing light exhibits no continuous spectrum. Accordingly, the generation of rainbow-colored light emission, which is caused in the conventional art, can be avoided.

Next, a third embodiment in which light-emitting materials other than those of a three-wavelength type that is shown above in the two embodiments are used will be described.

Here, an example of using only blue and red, that is, light-emitting materials for two colors is shown.

In the case of using the light-emitting materials for two colors, continuity of a spectrum in a visible light range is generally lower than the case of using the light-emitting materials for three colors, so that the generation of rainbow-colored light emission as mentioned above is reduced to a low level. However, a method shown in this embodiment can be adopted to reduce the generation to a still lower level.

The above-mentioned light-emitting materials represented by the chemical formulae (4) and (6) are used here as the specific light-emitting materials. That is, the following materials are used:

1. A compound represented by the chemical formula (4) as the blue light-emitting material; and 2. a compound represented by the chemical formula (6) as the red light-emitting material.

Those light-emitting materials are mixed as shown in "Monthly DISPLAY" (pp. 47-51, September, 2002), that is, with a whole amount of the light-emitting materials being 12 wt % of the light-emitting layer 16 of FIG. 1 and a mixture ratio of the blue light-emitting material and the red light-emitting material being 11.8:0.2. As a result, the materials emit light that is perceived as white by vision.

Figure 7:
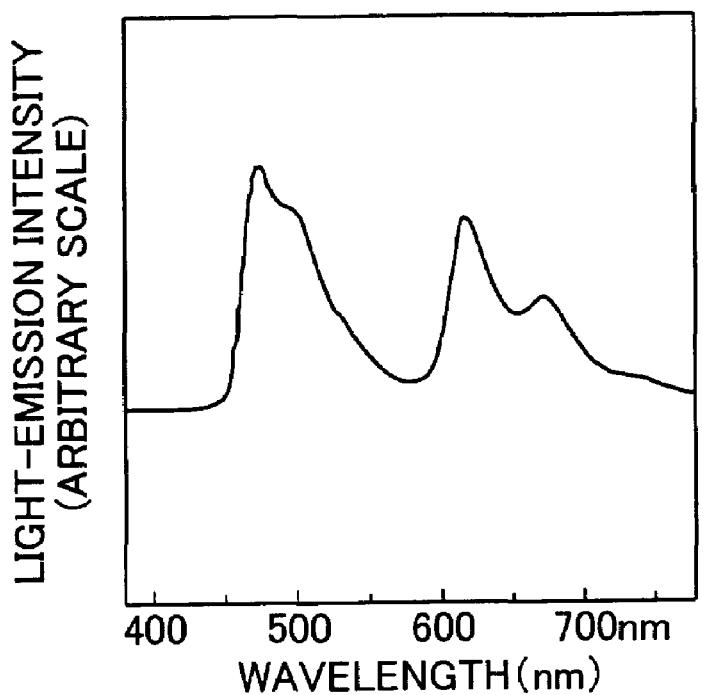
FIG. 7 is a diagram showing a light-emission spectrum of a light-emitting element formed of light-emitting materials for two colors in accordance with a third embodiment according to the first aspect of the present invention.

FIG. 7 shows a light-emission spectrum obtained by using the light-emitting materials for two colors in the case where the mixture ratio is 11.8:0.2 as described above.

Figure 8:
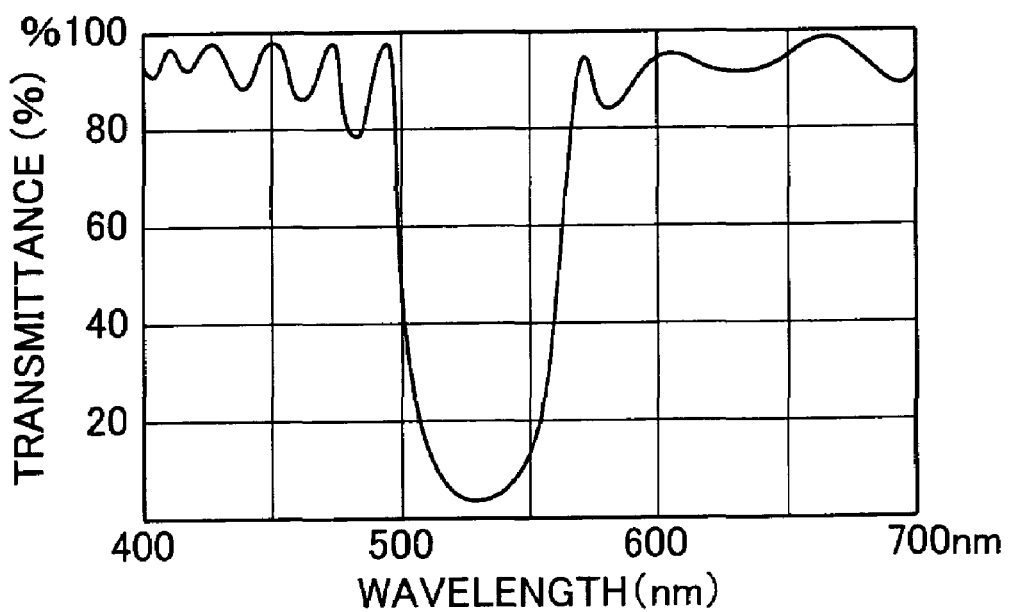
FIG. 8 is a diagram showing optical characteristics of a color-separation filter used for the light-emitting element in accordance with the third embodiment according to the first aspect of the present invention.

FIG. 8 shows an example of the color-separation filter 20 of FIG. 1 which selectively transmits light from the light-emitting layer 16 of FIG. 1 composed of those light-emitting materials.

According to this embodiment, the light-emitting element 10 is structured as shown in FIG. 1 by combining: the light-emitting layer 16 that is formed by using the triplet materials for two colors having the above-mentioned light-emitting characteristics; and the color-separation filter 20 that has spectral characteristics shown in FIG. 8 and formed on the light-emitting outermost surface (surface of the glass substrate 12) of the light-emitting portion. The combination enables the transmitted light to be suppressed to an extreme extent in the wave range ±25 nm or more apart from the maximum light-emission wavelengths of the respective R and B light-emitting materials.

The minimum value of the spectral product obtained from the light-emission waveform of the white light emitted from the light-emitting portion (the light-emitting layer 16) of the light-emitting element 10 and a spectral transmittance of the color-separation filter 20 is approximately 2% of a maximum value thereof. This percentage shows that the combination of the light-emitting portion (light-emitting layer 16) and the color-separation filter 20 is extremely preferable.

According to the above structure, the light that finally outgoes is substantially composed of the two colors (RB) each having a narrow band, and is perceived as white by human vision. However, the above outgoing light exhibits no continuous spectrum. Accordingly, the generation of rainbow-colored light emission, which is caused in the conventional art, can be avoided.

As described above in detail, according to the first aspect of the present invention, a remarkable effect can be produced to provide the light-emitting element such as an organic EL element, which includes a diffraction grating capable of enhancing light output efficiency without causing an observer to feel unnatural.

The light-emitting element according to the first aspect of the present invention is fundamentally structured as described above.

Next, FIGS. 3, 4, 6, and 9 to 15 are used to describe a light-emitting element according to a second aspect of the present invention.

Figure 9:
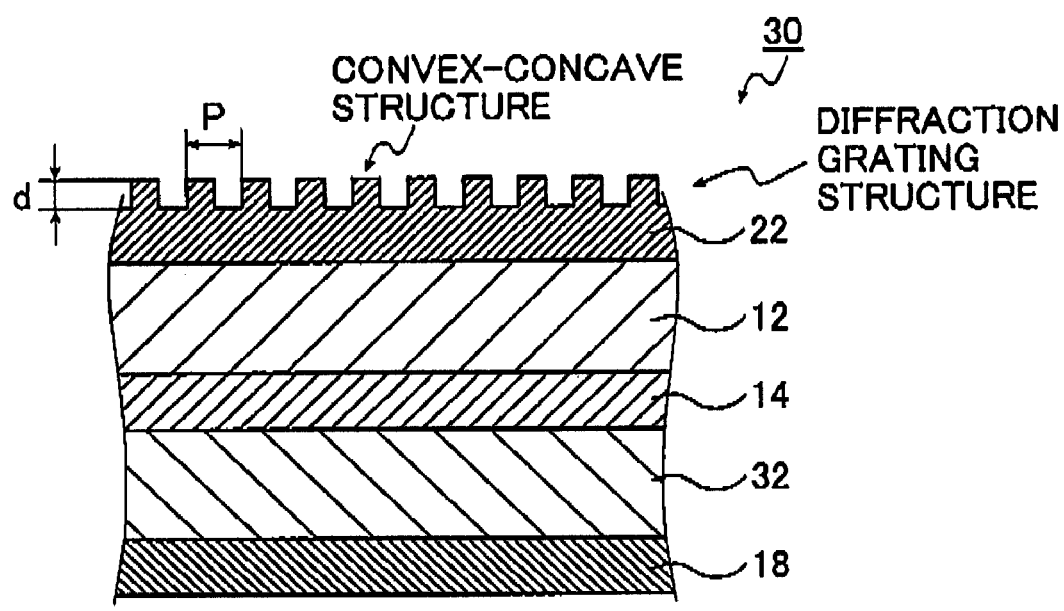
FIG. 9 is a sectional view showing an embodiment of a structure of a light-emitting element according to a second aspect of the present invention.

FIG. 9 is a sectional view showing a structure of a first embodiment of a light-emitting element 30 according to the second aspect of the present invention.

The light-emitting element 30 according to the second aspect of the present invention shown in FIG. 9 has the same structure as the light-emitting element 10 according to the first aspect of the present invention shown in FIG. 1, except that the light-emitting element 30 does not include the color-separation filter 20 and does include a light-emitting layer 32 instead of the light-emitting layer 16. Thus, the same constituent elements are denoted by the same reference numerals, and their detailed description is omitted.

That is, the light-emitting element 30 according to the second aspect of the present invention shown in FIG. 9 includes the light-emitting layer 32 to thereby attain a feature that a minimum light-emission value is equal to or less than 50% of a maximum light-emission value when the white light is emitted, this feature being attained by combining the light-emitting layer 16 and the color-separation filter 20 in the light-emitting element 10 according to the first aspect of the present invention shown in FIG. 1.

Here, the light-emitting element 30 showing in FIG. 9 includes: the glass substrate 12; layers formed on one side of the glass substrate 12, which include the ITO transparent electrode (anode) 14 having a linear shape, the light-emitting layer 32 capable of emitting light by EL, and the rear electrode (cathode) 18 having a linear shape, the respective layers being stacked in the stated order; and the diffraction grating 22 formed on the other side of the glass substrate 12.

The diffraction grating 22 may be obtained by providing the fine convex-concave structure described above directly to a surface of a material that composes the light-emitting outermost surface of the light-emitting element 10, that is, to an outer surface of the glass substrate 12 in this case. Alternatively, the diffraction grating 22 may be formed by bonding an optical film separately manufactured as the transmission-type optical film that has the fine convex-concave structure, to the light-emitting outermost surface of the light-emitting element 10 (outer surface of the glass substrate 12).

According to the second aspect of the present invention, the light-emitting layer 32 may be structured by using the singlet light-emitting materials or triplet light-emitting materials for three colors similarly to the first aspect of the present invention.

According to the first embodiment of this aspect as well, as the singlet light-emitting materials for three colors of the light-emitting layer 32 of the light-emitting element 30, it is possible to use the blue (B) light-emitting material, the green (G) light-emitting material, and the red (R) light-emitting material which are represented by the chemical formulae (1), (2), and (3), respectively. As described above, FIG. 3 shows the light-emission waveforms of the singlet light-emitting materials for the above-mentioned three colors, i.e., blue (B), green (G), and red (R).

According to this embodiment, the three kinds of light-emitting materials having the above-mentioned light-emitting characteristics are used at a light-emission ratio (here, expressed based on a luminance ratio among light emitted from all the light-emitting materials) described below. Accordingly, the light exhibits no continuous spectrum, making it possible to prevent the generation of rainbow-colored light emission while the light is perceived as white by human eyes.

Figure 10:
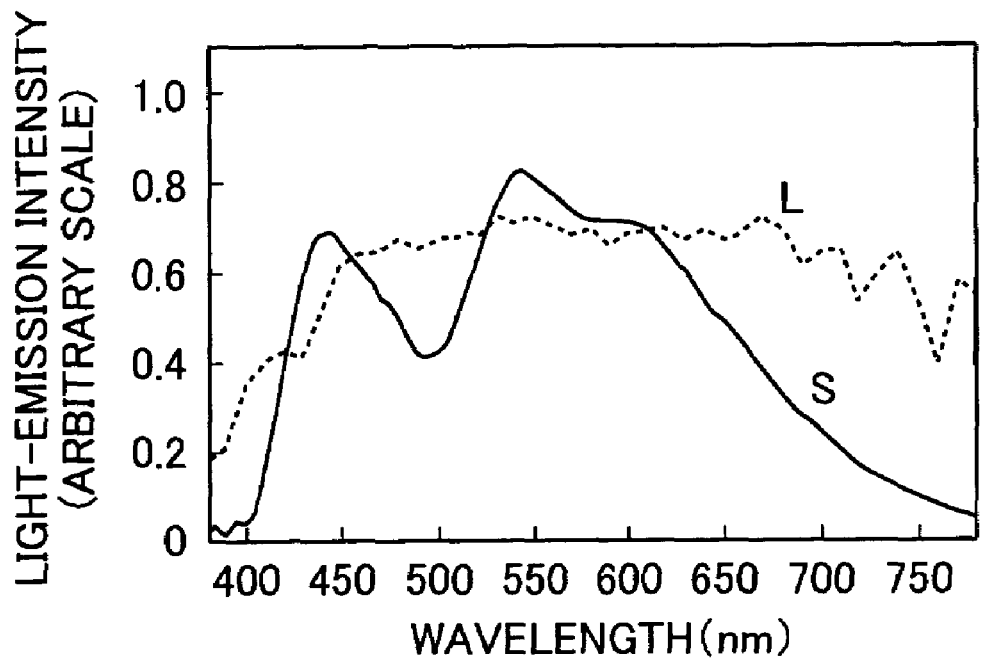
FIG. 10 is a diagram showing a light-emission waveform perceived as white by human eyes in the case where three kinds of singlet light-emitting materials as shown in FIG. 3 are caused to emit light at a predetermined light-emission ratio in a light-emitting element in accordance with a first embodiment according to the second aspect of the present invention.

FIG. 10 shows a white light-emission waveform in the case where three kinds of light-emitting materials having the above-mentioned light-emitting characteristics are caused to emit light at the light-emission ratio described below. The waveforms shown in FIG. 10 indicate the light that is perceived as white by human eyes.

In FIG. 10, a waveform L shown by a dotted line denotes a spectral waveform of a CIE standard source (daylight type) D50, and a waveform S shown by a solid line which corresponds to the waveform L denotes a light-emission waveform in the case where the three kinds of compounds are caused to emit light at a light-emission ratio of R:G:B=24:65:12 based on the luminance ratio.

According to this embodiment, the above three kinds of compounds are caused to emit light at the above light-emission ratio, so that as shown in FIG. 10, the minimum light-emission value of the light-emission waveform is equal to or less than 50% of the maximum light-emission value. In this state, the white light thus emitted (in a sense that the light is perceived as white by human eyes) exhibits no continuous spectrum, thereby leading to a state where a rainbow color does not appear.

That is, according to the above structure, the light that finally outgoes is perceived as white by human vision due to a large difference between the peak and the valley in a spectral distribution. However, the above outgoing light exhibits no continuous spectrum. Accordingly, the generation of rainbow-colored light emission, which is caused in the conventional art, can be avoided even through intermediation of the diffraction grating.

Next, as a second embodiment, description will be made of the case where the same light-emitting materials as those used above (that is, the singlet light-emitting materials represented by the chemical formulae (1), (2), and (3)) are used to reproduce spectral waveforms of CIE standard sources (fluorescent lamps) F3, F4, F11, and F12.

FIGS. 11 to 14 show comparisons between the above spectral waveforms (shown by dotted lines) of the CIE standard sources (fluorescent lamps) F3, F4, F11, and F12 and waveforms (shown by solid lines) reproduced by using the above light-emitting materials, respectively.

In this case as well, there arises the problem of the generation of rainbow-colored light emission unless the three kinds of light-emitting materials are caused to emit light at a special light-emission ratio exemplified as below.

Examples of such a light-emission ratio as to avoid the generation of rainbow-colored light emission are as follows.

Figure 11:
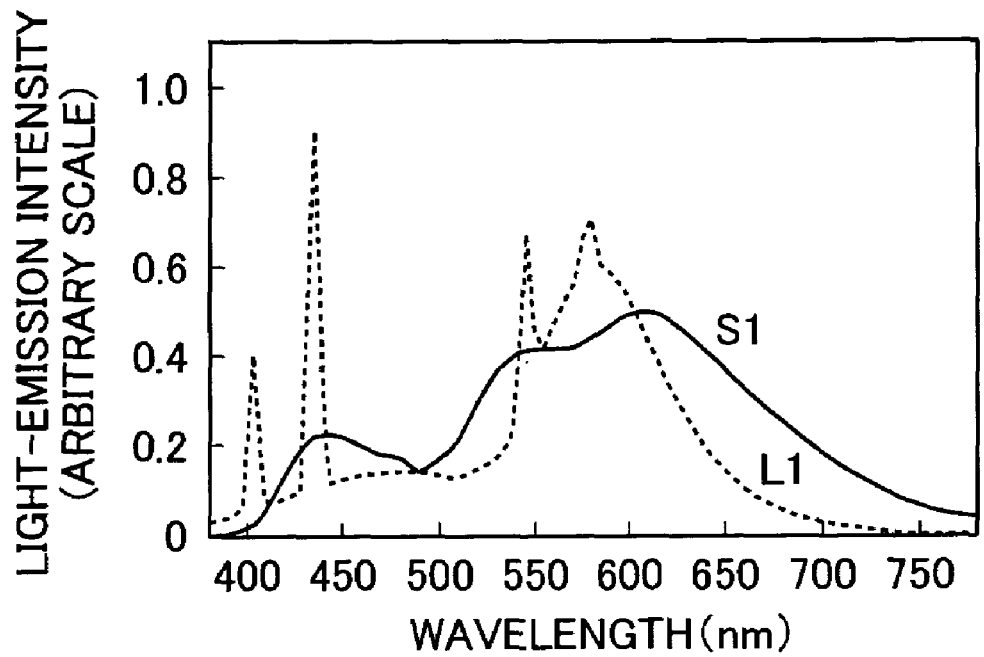
FIG. 11 is a diagram (i) showing a light-emission waveform perceived as white by human eyes in the case where the three kinds of singlet light-emitting materials as shown in FIG. 3 are caused to emit light at a predetermined light-emission ratio in a light-emitting element in accordance with a second embodiment according to the second aspect of the present invention.

For example, in FIG. 11, a waveform L1 shown by the dotted line denotes the spectral waveform of the CIE standard source (fluorescent lamp) F3, and a waveform S1 shown by the solid line which corresponds to the waveform L1 denotes the spectral waveform in the case where the above light-emitting materials (singlet light-emitting materials) are caused to emit light at a light-emission ratio of R:G:B=35:58:7 based on the luminance ratio.

The above two spectral waveforms are both perceived as white by human eyes. Here, the three kinds of compounds are caused to emit light at the above light-emission ratio, so that as shown in FIG. 11, the minimum light-emission value of the light-emission waveform is equal to or less than approximately 30% of the maximum light-emission value. In this state, the white light thus emitted exhibits no continuous spectrum, thereby leading to the state where the rainbow color does not appear.

Figure 12:
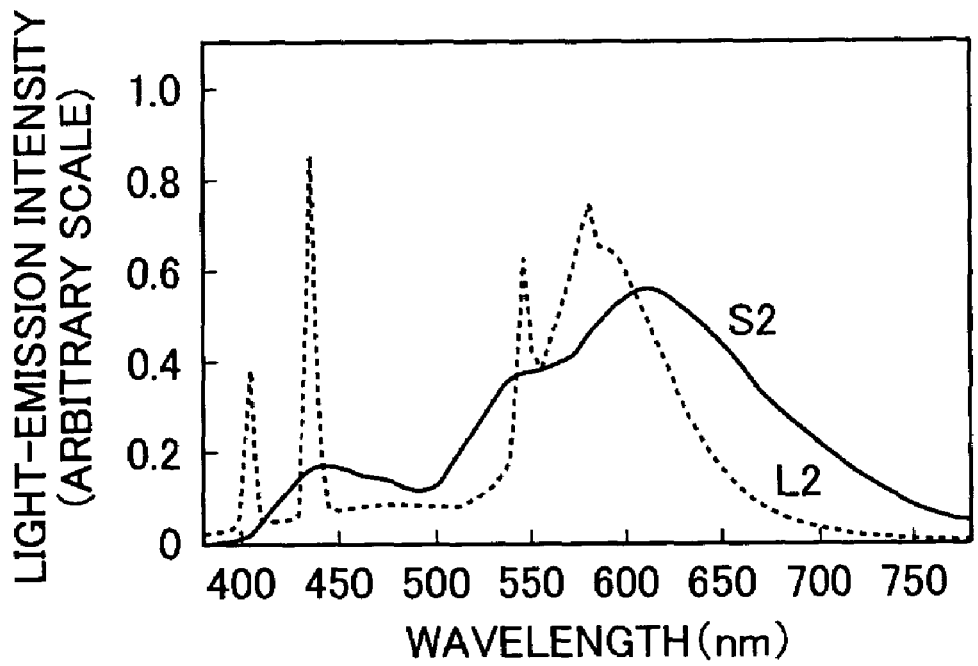
FIG. 12 is a diagram (ii) showing a light-emission waveform perceived as white by human eyes in the case where the three kinds of singlet light-emitting materials as shown in FIG. 3 are caused to emit light at a predetermined light-emission ratio in the light-emitting element in accordance with the second embodiment according to the second aspect of the present invention.
Figure 13:
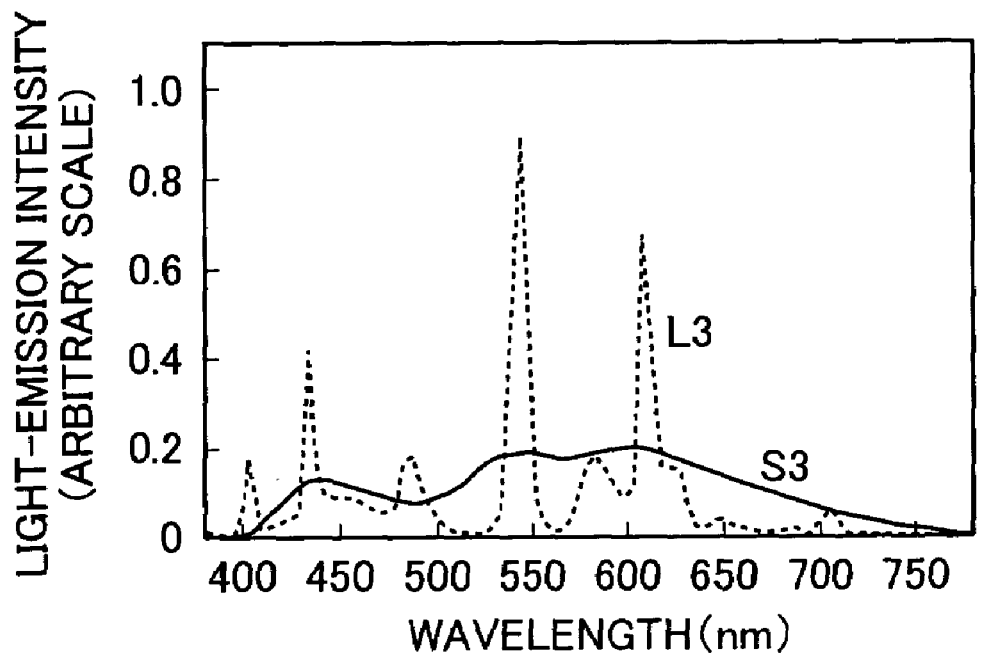
FIG. 13 is a diagram (iii) showing a light-emission waveform perceived as white by human eyes in the case where the three kinds of singlet light-emitting materials as shown in FIG. 3 are caused to emit light at a predetermined light-emission ratio in the light-emitting element in accordance with the second embodiment according to the second aspect of the present invention.
Figure 14:
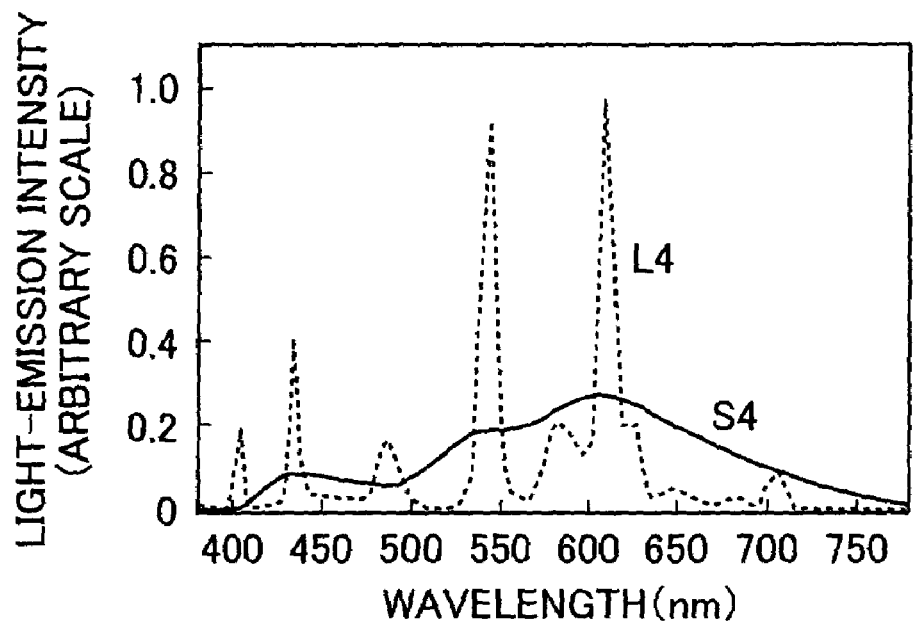
FIG. 14 is a diagram (iv) showing a light-emission waveform perceived as white by human eyes in the case where the three kinds of singlet light-emitting materials as shown in FIG. 3 are caused to emit light at a predetermined light-emission ratio in the light-emitting element in accordance with the second embodiment according to the second aspect of the present invention.

Also in the cases shown in FIGS. 12 to 14, the waveforms L2, L3, and L4 shown by the dotted lines denote the spectral waveforms of the CIE standard sources (fluorescent lamps) F4, F11, and F12, respectively, and waveforms S2, S3, and S4 shown by the solid lines which correspond to the waveforms L2, L3, and L4, respectively, denote the spectral waveforms in the case where the above singlet light-emitting materials are caused to emit light at predetermined light-emission ratios based on the luminance ratios. In each of the cases, the minimum light-emission value of the light-emission waveform is equal to or less than approximately 45% of the maximum light-emission value, and the state where the rainbow color does not appear can be achieved when the white light is emitted.

Note that the light-emission ratios of the three kinds of compounds in the respective cases shown in FIGS. 12 to 14 are R:G:B=42:53:5, 30:61:9, and 41:54:5, respectively. However, other ratios of the RGB combination than the above are naturally possible.

According to the above structure, the light that finally outgoes is perceived as white by human vision due to the large difference between the peak and the valley in the spectral distribution. However, the above outgoing light exhibits no continuous spectrum. Accordingly, the generation of rainbow-colored light emission, which is caused in the conventional art, can be avoided even through intermediation of the diffraction grating.

Next, a third embodiment in which materials that emit light by a triplet exciton (so-called "triplet materials") are used will be described. In the third embodiment, an example of using only blue and red, that is, the light-emitting materials for two colors is shown.

Here, as the light-emitting materials, it is possible to use the blue (B) light-emitting material and the red (R) light-emitting material which are represented by the chemical formulae (4) and (6), respectively. As described above, FIGS. 4 and 6 show the light-emission waveforms of the triplet light-emitting materials for the two colors, i.e., blue (B) and red (R).

In the case of using the light-emitting materials for two colors, the continuity of the spectrum in the visible light range is generally lower than the case of using the light-emitting materials for three colors, so that the generation of rainbow-colored light emission is reduced to a low level. However, a method shown in this embodiment can be adopted to reduce the generation to a still lower level.

Figure 15:
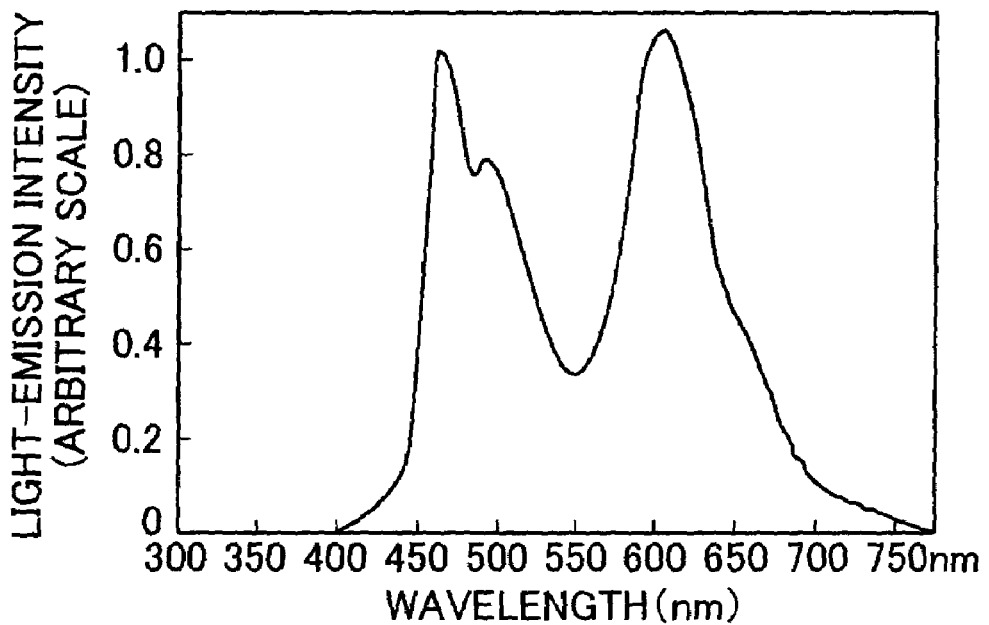
FIG. 15 is a diagram showing a light-emission waveform perceived as white by human eyes in the case of a light-emitting element in accordance with a third embodiment according to the second aspect of the present invention in which the blue light-emitting material shown in FIG. 4 is mixed with the red light-emitting material shown in FIG. 6 at a predetermined mixture ratio.

Those light-emitting materials for two colors are mixed as shown in "Monthly DISPLAY" (pp. 47-51, September, 2002), that is, with the whole amount of the light-emitting materials being 12 wt % of the light-emitting layer 32 of FIG. 9 and the mixture ratio of the blue light-emitting material and the red light-emitting material being 11.8:0.2. As a result, the materials emit light that is perceived as white by vision. FIG. 15 shows a light-emission spectrum obtained by using the light-emitting materials for two colors in the case where the mixture ratio (based on a ratio of concentration) is 11.8:0.2 as described above.

According to this embodiment, the two kinds of compounds are mixed at the above mixture ratio for use, so that as shown in FIG. 15, the minimum light-emission value of the light-emission waveform is equal to or less than 50% of the maximum light-emission value. In this state, the white light thus emitted (in a sense that the light is perceived as white by human eyes) exhibits no continuous spectrum, thereby leading to the state where a rainbow color does not appear.

That is, according to the above structure, the light that finally outgoes is perceived as white by human vision due to the large difference between the peak and the valley in the spectral distribution. However, the above outgoing light exhibits no continuous spectrum. Accordingly, the generation of rainbow-colored light emission, which is caused in the conventional art, can be avoided even through intermediation of the diffraction grating.

As described above in detail, according to the second aspect of the present invention, a remarkable effect can be produced to realize the light-emitting element capable of enhancing light output efficiency without causing an observer to feel unnatural.

More specifically, according to the second aspect of the present invention, an effect can be produced to provide the light-emitting element free from the problem in that the white light emission becomes rainbow-colored in the organic EL element obtained by providing the diffraction grating film to a glass substrate surface.

The light-emitting element according to the second aspect of the present invention is fundamentally structured as described above.

Note that the above embodiments are each described as an embodiment of each aspect of the present invention, and the present invention therefore should not be limited thereto. Naturally, various modifications and appropriate improvements can be made within the scope without departing from the gist of the present invention.

For example, according to the first aspect of the present invention, other various kinds of materials can be used for the light-emitting materials composing the light-emitting element, the color-separation filter used in combination therewith, and the like within a range in which the above-mentioned characteristics are retained. Further, the color-separation filter can be formed to have a multi-layer structure instead of a single layer structure.

Further, for example, according to the second aspect of the present invention, other various kinds of materials can be used for the light-emitting materials composing the light-emitting element within the range in which the above-mentioned characteristics are retained.

What is claimed is:

1. A light-emitting element which emits light using organic electroluminescence, comprising:
    a light-emitting portion having a higher refractive index than a refractive index of air, comprising:
       a transparent substrate,
       a transparent electrode formed on one side of said substrate,
       an organic compound layer formed on said transparent electrode, said organic compound layer including a light-emitting layer, and
       a rear electrode formed on said organic compound layer;
    a color-separation filter formed on the other side of said substrate,
    a diffraction grating structure formed on said color-separation filter, having a pitch of a fine convex-concave structure being in a range from 1 µm to 4 µm, and a depth of the fine convex-concave structure being in a range from 0.4 µm to 4 µm,
    wherein said color separation filter is selected so that, when white light is emitted from said light-emitting portion, a minimum value of a spectral product obtained from a light-emission waveform of the white light and a spectral transmittance of said color-separation filter is equal to or less than 50% of a maximum value thereof.

2. A light-emitting element which emits light using organic electroluminescence, comprising:
    a light-emitting portion having a higher refractive index than a refractive index of air, comprising:
       a transparent substrate,
       a transparent electrode formed on one side of said substrate,
       an organic compound layer formed on said transparent electrode, said organic compound layer including a light-emitting layer, and
       a rear electrode formed on said organic compound layer;
    a color-separation filter formed on the other side of said substrate,
    a diffraction grating structure formed on said color-separation filter, having a pitch of a fine convex-concave structure being in a range from 1 µm to 4 µm, and a depth of the fine convex-concave structure being in a range from 0.4 µm to 4 µm,
    wherein said light-emitting portion emits white light, and
    wherein a minimum value of a spectral product obtained from a light-emission waveform of the white light and a spectral transmittance of said color-separation filter is equal to or less than 50% of a maximum value thereof.

3. A light-emitting element which emits light using organic electroluminescence, comprising:
    a light-emitting portion having a higher refractive index than a refractive index of air, comprising:
       a transparent substrate,
       a transparent electrode formed on one side of said substrate,
       an organic compound layer formed on said transparent electrode, said organic compound layer including a light-emitting layer, and
       a rear electrode formed on said organic compound layer;
    a diffraction grating structure formed on the other side of said substrate, said diffraction grating structure having a pitch of a fine convex-concave structure being in a range from 1 µm to 4 µm, and a depth of the fine convex-concave structure being in a range from 0.4 µm to 4 µm,
    wherein said light-emitting layer includes light-emitting materials for at least two primary colors emitting white light among light-emitting materials for three primary colors, and
    wherein a light-emission ratio of the light emitting materials for said at least two primary colors among the light-emitting materials for the three primary colors is adjusted to make a minimum light-emission value equal to or less than 50% of a maximum light-emission value when white light is emitted from said light-emitting portion.

4. A light-emitting element which emits light using organic electroluminescence, comprising:
    a light-emitting portion having a higher refractive index than a refractive index of air, comprising:
       a transparent substrate,
       a transparent electrode formed on one side of said substrate,
       an organic compound layer formed on said transparent electrode, said organic compound layer including a light-emitting layer, and
       a rear electrode formed on said organic compound layer;
    a diffraction grating structure formed on the other side of said substrate, said diffraction grating structure having a pitch of a fine convex-concave structure being in a range of 1 µm to 4 µm, and a depth of the fine convex-concave structure being in a range from 0.4 µm to 4 µm,
    wherein said light-emitting layer includes light-emitting materials for at least two primary colors among light-emitting materials for three primary colors,
    wherein said light-emitting portion emits white light, and
    wherein a minimum light-emission value is equal to or less than 50% of a maximum light-emission value.

* * * * *